(12) United States Patent
Wang et al.

(10) Patent No.: US 9,812,177 B2
(45) Date of Patent: *Nov. 7, 2017

(54) CIRCUIT, METHOD OF USING THE CIRCUIT AND MEMORY MACRO INCLUDING THE CIRCUIT

(71) Applicant: TAIWAN SEMICONDUCTOR MANUFACTURING COMPANY, LTD., Hsinchu (TW)

(72) Inventors: Bing Wang, Palo Alto, CA (US); Kuoyuan (Peter) Hsu, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/823,107

(22) Filed: Aug. 11, 2015

(65) Prior Publication Data
US 2015/0348597 A1   Dec. 3, 2015

Related U.S. Application Data

(63) Continuation of application No. 13/892,887, filed on May 13, 2013, now Pat. No. 9,117,497.

(Continued)

(51) Int. Cl.
*G11C 5/06* (2006.01)
*G11C 7/10* (2006.01)
(Continued)

(52) U.S. Cl.
CPC ............ *G11C 5/063* (2013.01); *G11C 7/106* (2013.01); *G11C 7/1012* (2013.01); *G11C 7/18* (2013.01);
(Continued)

(58) Field of Classification Search
CPC ....... G11C 11/418; G11C 11/412; G11C 8/14; G11C 5/063; G11C 7/106; G11C 7/1012; H01L 27/1104; H01L 27/1116
(Continued)

(56) References Cited

U.S. PATENT DOCUMENTS 6,385,097 B1    5/2002  Liao et al.
7,293,158 B2 *  11/2007 Calvignac ............ H04L 49/901
                                                                711/155

(Continued)

*Primary Examiner* — Pho M Luu
*Assistant Examiner* — Xiaochun L Chen
(74) *Attorney, Agent, or Firm* — Hauptman Ham, LLP

(57) ABSTRACT

A circuit includes a first latch for generating a first latched signal; and a first comparator for comparing the first latched signal and a write address, and generating a first comparator signal. The circuit includes a first logic circuit for receiving the first comparator signal and a fourth latched signal, and generating a first logic circuit output signal; and a second latch for receiving the first logic circuit output signal and generating a second latched signal. The circuit includes a third latch for generating a third latched signal; and a second comparator for comparing the third latched signal and a read address, and generating a second comparator signal. The circuit includes a second logic circuit for receiving the second comparator signal and the second latched signal, and generating a second logic circuit signal; and a fourth latch for receiving the second logic circuit signal and generating the fourth latched signal.

20 Claims, 5 Drawing Sheets

Related U.S. Application Data

(60) Provisional application No. 61/799,219, filed on Mar. 15, 2013.

(51) Int. Cl.
    *G11C 7/18*      (2006.01)
    *G11C 8/08*      (2006.01)
    *G11C 8/12*      (2006.01)
    *G11C 8/16*      (2006.01)
    *G11C 11/418*    (2006.01)

(52) U.S. Cl.
    CPC .................. *G11C 8/08* (2013.01); *G11C 8/12* (2013.01); *G11C 8/16* (2013.01); *G11C 11/418* (2013.01)

(58) Field of Classification Search
    USPC .......................................... 365/189.07, 233.1
    See application file for complete search history.

(56) References Cited

U.S. PATENT DOCUMENTS

| | | | |
|---|---|---|---|
| 9,117,497 B2 * | 8/2015 | Wang | ..................... G11C 5/063 |
| 2006/0209827 A1 * | 9/2006 | Calvignac | ............. H04L 49/901 |
| | | | 370/392 |
| 2008/0232233 A1 | 9/2008 | Spirkl et al. | |
| 2013/0083591 A1 | 4/2013 | Wuu et al. | |

* cited by examiner

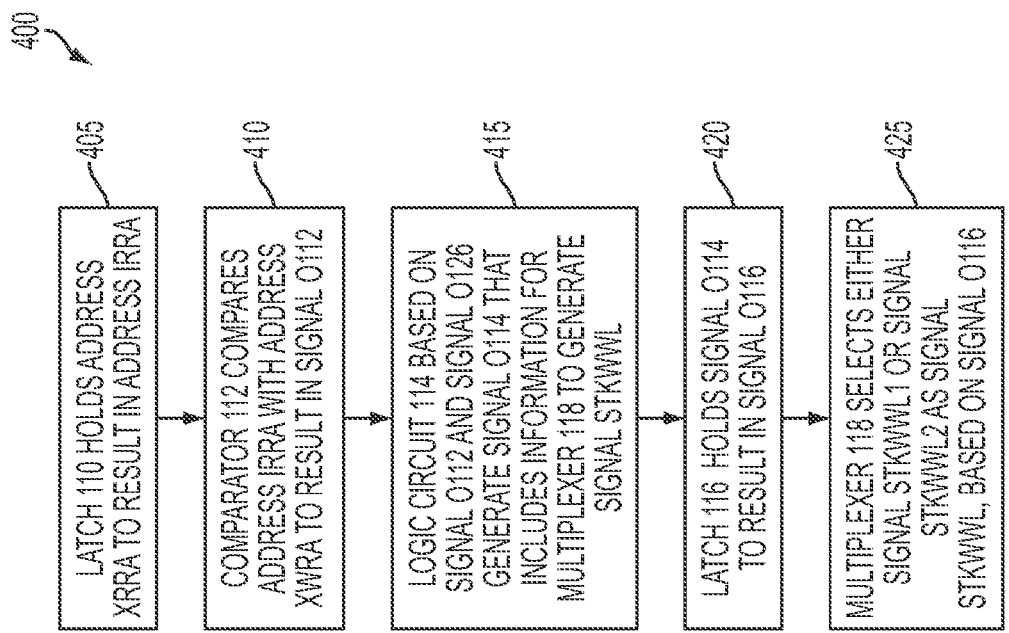

US 9,812,177 B2

CIRCUIT, METHOD OF USING THE CIRCUIT AND MEMORY MACRO INCLUDING THE CIRCUIT

PRIORITY CLAIM

The present application is a continuation of U.S. application Ser. No. 13/892,887, filed May 13, 2013, now U.S. Pat. No. 9,117,497, issued Aug. 25, 2015, which claims priority of U.S. Provisional Application No. 61/799,219, filed Mar. 15, 2013, which are incorporated herein by reference in their entireties.

FIELD

The present disclosure is related to electrical lines with coupling effects.

BACKGROUND

When two electrical lines in a circuit are close to one another, such as being physically next to each other, each line causes electrical effects on the other line. Such electrical effects are called coupling effects and degrade performance of related circuits.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 4 is a flowchart of a method of operating a sub-circuit of the circuit in FIG. 3, in accordance with some embodiments.

Like reference symbols in the various drawings indicate like elements.

DETAILED DESCRIPTION

Figure 1:
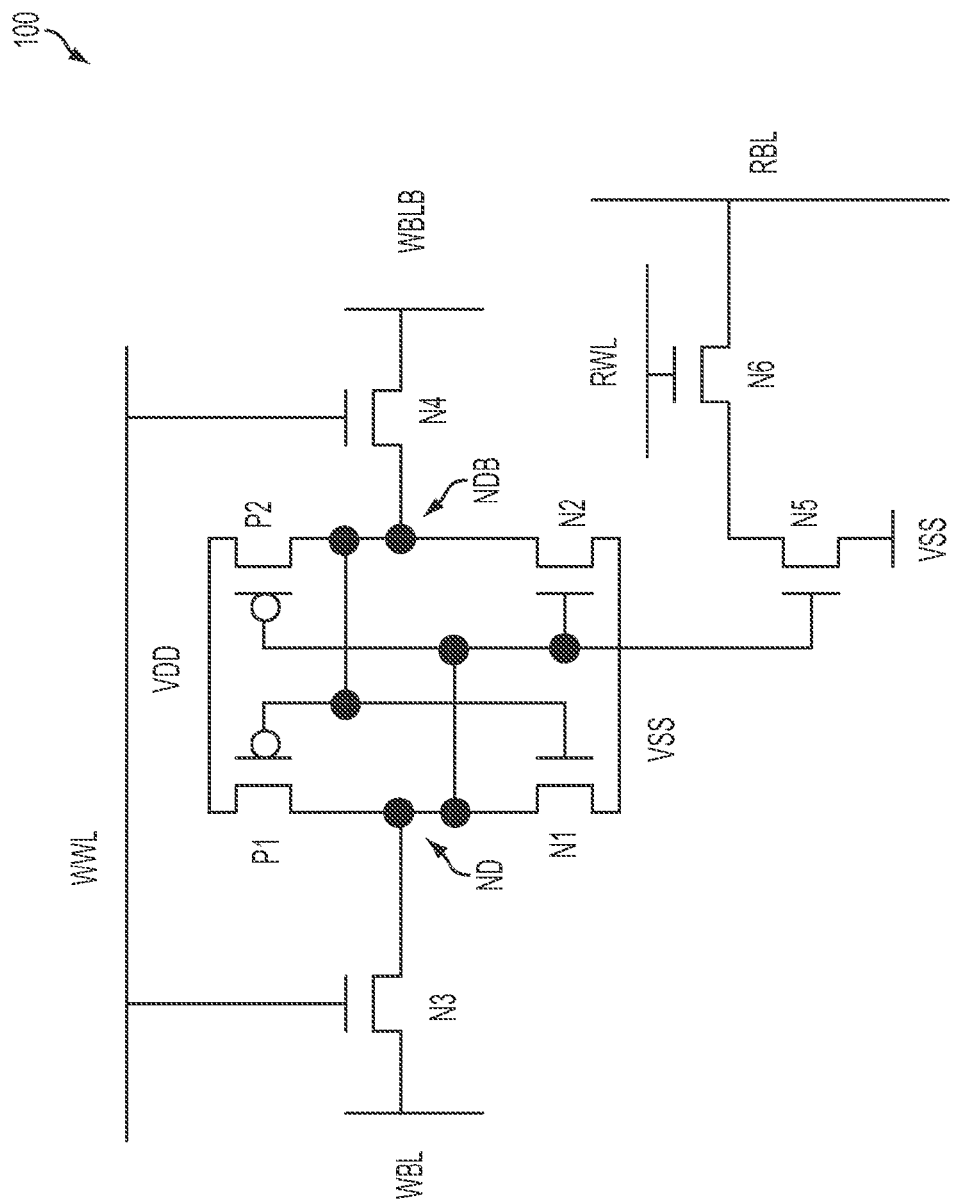
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a tracking circuit is designed to take accounts of coupling effects of a write word line and a read word line of two memory cells. The first memory cell of the two memory cells is under a write operation and therefore has an active write word line. The second memory cell is under a read operation and therefore has an active read word line. When the two memory cells are on two different rows, the active write word line and read word line do not have coupling effects. In the present disclosure, the description that two lines "do not have coupling effects" refers to the fact that the electrical coupling between the two lines is insignificant and acceptable because such insignificant coupling does not affect functionality of related circuitry. The tracking circuit therefore generates two tracking signals based on an emulation without coupling effects. But when the two memory cells are on the same row, the active write word line and read word line have coupling effects. The tracking circuit therefore generates two tracking signals based on an emulation with coupling effects.

The below description is explained in the context of a memory macro having two arrays of memory cells. Tracking refers to generating tracking signals for a write or a read operation of a memory cell. For example, in a write operation, write signals of the memory cell under a write operation are generated based on tracking write signals. The tracking write signals include delay times and other electrical behaviors of circuit components in the write path of the memory cell under the write operation. As a result, when the write signals are provided to the memory cell for writing, the write signals include sufficient signal margins to correctly write data to the memory cell under the write operation. Similarly, when read signals are generated based on the tracking read signals, the read signals include sufficient signal margins to correctly read data from the memory cell under the read operation.

Memory Cell

FIG. 1 is a circuit diagram of a memory cell 100, in accordance with some embodiments. In some embodiments, a plurality of memory cells 100 is arranged in rows and columns of a memory array 138 in FIG. 2A.

Memory cell 100 includes two P-type metal oxide semiconductor (PMOS) transistors P1 and P2, and six N-type metal oxide semiconductor (NMOS) transistors N1, N2, N3, N4, N5, and N6. Transistors P1, P2, N1, and N2 form a cross latch or a cross-coupled inverters. Transistors P1 and N1 form a first inverter while transistors P2 and N2 form a second inverter. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1.

A write word line WWL is coupled with a gate of each of transistors N3 and N4 of a plurality of memory cells 100 in a row of memory cells. Write word line WWL is also called a write control line because the signal on write word line WWL controls transistors N3 and N4 for data on write bit lines WBL and WBLB to be written to corresponding nodes ND and NDB.

Each of transistor N3 and transistor N4 is called a pass gate transistor. Drains of transistors N3 and N4 are coupled to the pair of write bit lines WBL and WBLB, respectively. Write bit lines WBL and WBLB are coupled to each drain of transistors N3 and N4 of a plurality of memory cells 100 in a column of memory array 138 in FIG. 1B. Each of write bit lines WBL and WBLB are also called a write data line because data carried on write bit lines WBL and WBLB are written to corresponding nodes ND and NDB.

In a write operation of memory cell 100, data to be written to memory cell 100 is applied to write bit lines WBL and WBLWB. Write word line WWL is then activated to turn on transistors N3 and N4. As a result, the data on bit lines BL and BLB is transferred to and is stored in corresponding nodes ND and NDB.

Transistors N5 and N6, a read word line RWL and a read bit line RBL form a read port to process data read from nodes ND and NBD. Read bit line RBL is coupled with memory cells 100 in a column. In a read operation of memory cell 100, read bit line RBL is pre-charged with a high logical value. Read word line RWL is activated to turn on transistor N6. The data stored in node ND turns on or off transistor N5. For example, if node ND stores a high logical value, transistor N5 is turned on. Turned-on transistors N5 and N6 then pull read bit line RBL to supply reference voltage VSS or a low logical value at a source of transistor N5. But if node ND stores a low logical value, transistor N5 is turned off and operates as an open circuit. As a result, read bit line RBL remains at the pre-charge high logical value. Detecting a logical value on read bit line therefore reveals the logical value stored in node ND. By operation of memory cell 100, node NDB stores a logical value inversed from the logical value on node ND. Detecting the logical value on read bit line RBL therefore also reveals the data stored on node NDB.

In some embodiments, write word line WWL and read word line RWL of memory cells 100 in a row are physically next to each other. When a first memory cell 100 is under a write operation, for example, the corresponding write word line WWL is activated. Similarly, when a second memory cell 100 is under a read operation, for example, the corresponding read word line RWL is activated. If the memory under the write operation and the memory under the read operation are on a same row, the corresponding active write word line WWL and read word line RWL have coupling effects on one another. In contrast, if the memory under the write operation and the memory under the read operation are on two different rows, the corresponding active write word line WWL and read word line RWL do not have coupling effects.

Memory Macro

Figure 2A:
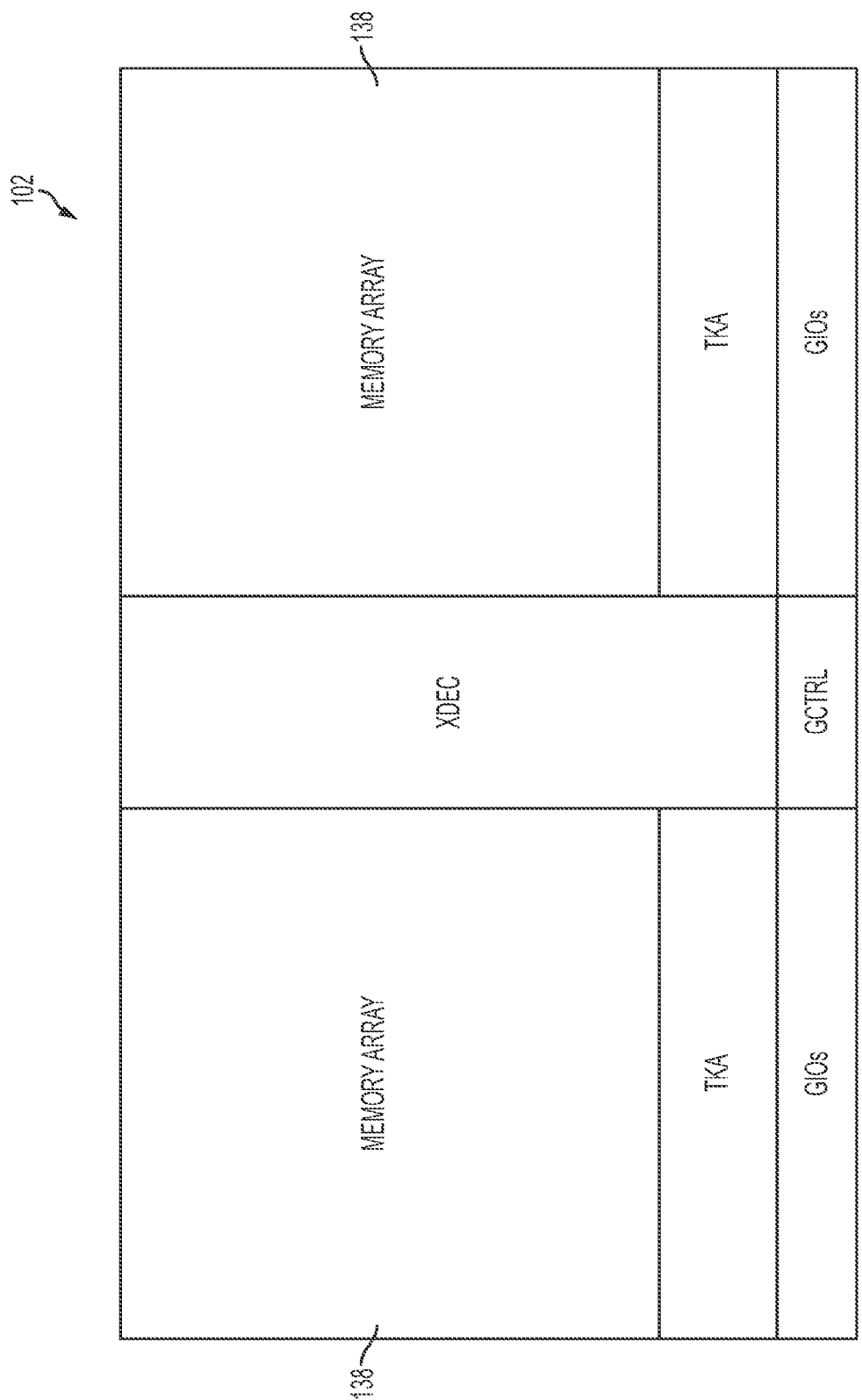
FIG. 2A is a diagram of a memory macro, in accordance with some embodiments.

FIG. 2A is a diagram of a memory macro 102 in accordance with some embodiments. Memory macro 102 is a static random access memory (SRAM) macro, and is used for illustration. Other types of memories are within the contemplated scope of the present disclosure.

Memory macro 102 is symmetrical. For example, with reference to a decoder XDEC or a global control circuit (GCTRL), circuit elements on the left side of memory macro 102 are similar to circuit elements on the right side of memory macro 102. For another example, memory macro 102 includes two memory arrays 138. One memory array 138 is on the left side of memory macro 100 and one memory array 138 is on the right side of memory macro 102. Memory cells in each of memory arrays 138 are arranged in rows and columns.

Decoder XDEC includes address decoders to identify memory cells 100 in the X– or row directions, control circuits to control inputs and outputs of memory cells 100 in a corresponding memory array of the memory arrays 138, etc.

Figure 2B:
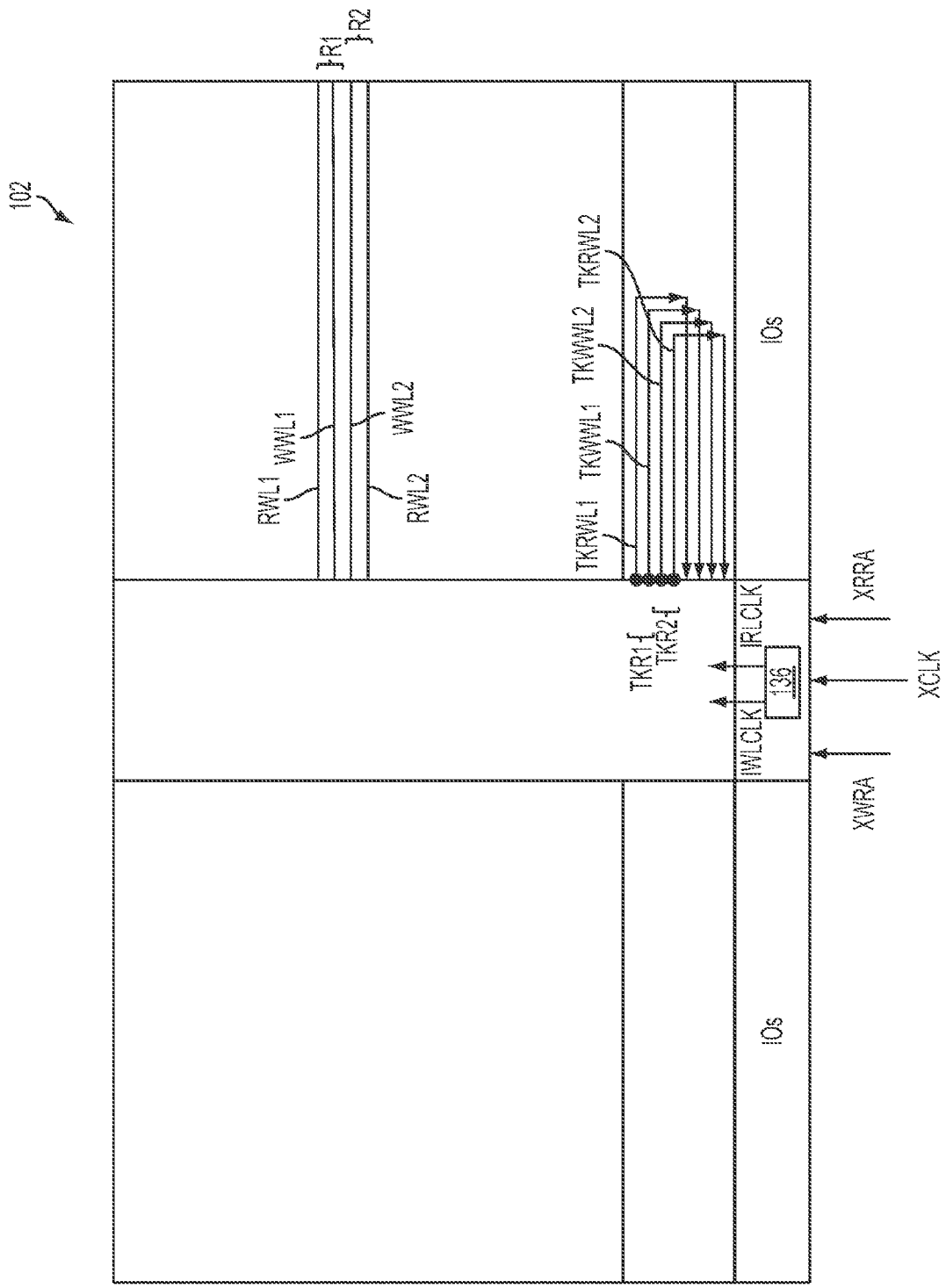
FIG. 2B is a diagram of the memory macro in FIG. 2A having electrical lines, in accordance with some embodiments.

Tracking areas TKA include circuits related to tracking, such as tracking write word lines and tracking read word lines shown in FIG. 2B, for example.

A plurality of global input-output (GIOs) serves to transfer data between memory cells 100 in a corresponding memory 138 and other circuits outside of memory macro 102.

Global control circuit GCTRL provides the row address, the column address pre-decode, clock, and other signals for memory macro 102. Global control circuit GCTRL also controls data transfer between memory cells 100 in memory arrays 138 and corresponding circuits outside of memory macro 102.

Electrical Lines

FIG. 2B is a diagram of memory macro 102 in FIG. 2A, in accordance with some embodiments. Memory macro 102 in FIG. 2B is used to illustrate coupling effects of write word line WWL and read word line RWL of memory cells 100 in a row. For simplicity, various elements of memory macro 102 labeled in FIG. 2A are not labeled in FIG. 2B.

Memory array 138 includes a plurality of rows of memory cells 100. Each row includes a write word line WWL and a read word line RWL. As a result, memory array 108 includes a plurality of write word lines WWL and a plurality of read word lines RWL. Write word line WWL and read word line RWL are each coupled with memory cells 100 of the row. For illustrations, two rows R1 and R2 of a plurality of rows are shown. A pair of read word line RWL1 and write word line WWL1 belong to row R1, and a pair of write word line WWL2 and read word line RWL2 belong to row R2. For simplicity, memory cells 100 coupled with lines WWL1, WWL2, RWL1, and RWL2 are not shown. For illustrations, signals on lines WWL1, WWL2, RWL1, and RWL2 are called SWWL1, SWWL2, SRWL1, and SRWL2, respectively. Signals SWWL1, SWWL2, SRWL1, and SRWL2 are not labeled.

In some embodiments, read word line RWL and write word line WWL of a row of memory of cells 100 are physically next to one another. For example, read word line RWL1 and write word line WWL1 are next one another. Similarly, write word line WWL2 and read word line RWL2 are next to one another. For ease of illustrations, electrical lines physically next to one another are considered to have coupling effects. For example, signal SRWL1 on read word line RWL1 and signal SWWL1 on write word line WWL1 have coupling effects. Similarly, signal SWWL2 on write word line WWL2 and signal SRWL2 on read word line RWL2 have coupling effects.

In contrast, signals that are not next to each other do not have coupling effects or have insignificant coupling effects that are considered as having no coupling effects. For example, signal SRWL1 on read word line RWL1 and signal SWWL2 on write word line WWL2 are not next to each other, and do not have coupling effects. Similarly, signal SWWL1 on write word line WWL1 and signal SRWL2 on read word line RWL2 are not next to each other, and do not have coupling effects.

For illustration, a first memory cell 100W (not labeled) is under a write operation, and a corresponding write word line WWL is activated. Similarly, a second memory cell 100R (not labeled) is under a read operation, and a corresponding read word line RWL is activated. If memory cells 100W and 100R are on a same row, such as a row R1, the corresponding active write word line WWL1 and read word line RWL1 are physically next to each other, and have coupling effects. Similarly, if memory cells 100W and 100R are on the same row R2, the corresponding active write word line WWL2 and read word line RWL2 are physically next to each other, and have coupling effects. In contrast, if memory cell 100W and memory cell 100R are on two different rows, the corresponding write word line WWL and read word line RWL do not have coupling effects.

A pair of tracking read word lines TKRWL1 and TKRWL2 is used with a corresponding pair of read word lines RWL of the plurality of read word lines RWL. Similarly, a pair of tracking write word lines TKWWL1 and TKWWL2 is used with a corresponding pair of write word lines WWL of the plurality of write word lines WWL. For illustration, tracking read word line TKRWL1 corresponds to read word line RWL1. Tracking write word line TKWWL1 corresponds to write word line WWL1. Tracking write word line TKWWL2 corresponds to write word line WWL2, and tracking read word line TKRWL2 corresponds to read word line RWL2. Signals on lines TKRWL1, TKWWL1, TKWWL2, and TKRWL2 are called STKRWL1, STKWWL1, STKWWL2, and STKRWL2, respectively. Signals STKRWL1, STKWWL1, STKWWL2, and STKRWL2 are not labeled.

In the illustration shown in FIG. 2B, each of a line TKRWL1, TKWWL1, TKWWL2, or TKRWL2 includes two portions, such as two halves, of two distinct lines of two separate rows. For example, a first half belongs to a line of a first row while a second half belongs to a line of a second row. Embodiments of the present disclosure, however, are not limited by how each of the line TKRWL1, TKWWL1, TKWWL2, or TKRWL2 is formed as long as a pair of signals among signals STKRWL1, STKWWL1, STKWWL2, and STKRWL2 have or do not have coupling effects as selected in accordance with the spirit and scope of the present disclosure.

Tracking read word line TKRWL1 and tracking write word line TKWWL1 are next to one another and are considered a pair TKR1. As a result, signals STKRWL1 and STKWWL1 have coupling effects. Tracking write word line TKWWL2 and tracking read word line TKRWL2 are next to one another and are considered a pair TKR2. As a result, signals STKWWL2 and STKRWL2 have coupling effects. In contrast, tracking read word line TKRWL1 and tracking write word line TKWWL2 are not next to each other. As a result, signals STKRWL1 and STKWWL2 do not have coupling effects. Tracking write word line TKWWL1 and tracking read word line TKRWL2 are not next each other. As a result, signals STKWWL1 and STKRWL2 do not have coupling effects.

In some embodiments, a tracking circuit is configured to generate tracking write signals STKWWL1 and STKWWL2. Based on tracking write signals STKWWL1 and STKWWL2, write signals are generated. Similarly, based on tracking read signals STKRWL1 and STKRWL2, read signals are generated. Embodiments of the present disclosure are not limited to how the write signals or the read signals are generated from tracking signals STKWWL1, STKRWL1, STKWWL2, and STKRWL2.

In some embodiments, when write word line WWL of memory cell 100W and read word line RWL of memory cell 100R have coupling effects, corresponding tracking signals that have coupling effects are generated. For example, tracking signals STKRWL1 and STKWWL1 are generated. Alternatively, tracking signals STKRWL2 and STWWL2 are generated.

In contrast, when write word line WWL of memory cell 100W and read word line RWL of memory cell 100R do not have coupling effects, corresponding tracking signals that do not have coupling effects are generated. For example, tracking signals STKRWL1 and STKWWL2 are generated. Alternatively, tracking signals STKRWL2 and STKWWL1 are generated.

In some embodiments, a clock generator circuit 136 receives a clock signal XCLK external from memory macro 102. In a read operation, clock generator circuit 136, based on a rising edge of clock signal XCLK, generates a rising edge of a clock signal IRLCLK. In a write operation, clock generator circuit 136, based on a rising edge of clock signal XCLK, generates a rising edge of a clock signal IWLCLK.

A write row address XWRA refers to a row address of memory cell 100W to be written, and a write operation is based on clock signal IWLCLK. A read row address XRRA refers to a row address of memory cell 100R to be read, and a read operation is based on clock signal IRLCLK.

Circuit Generating Tracking Write Word Line and Tracking Read Word Line

Figure 3:
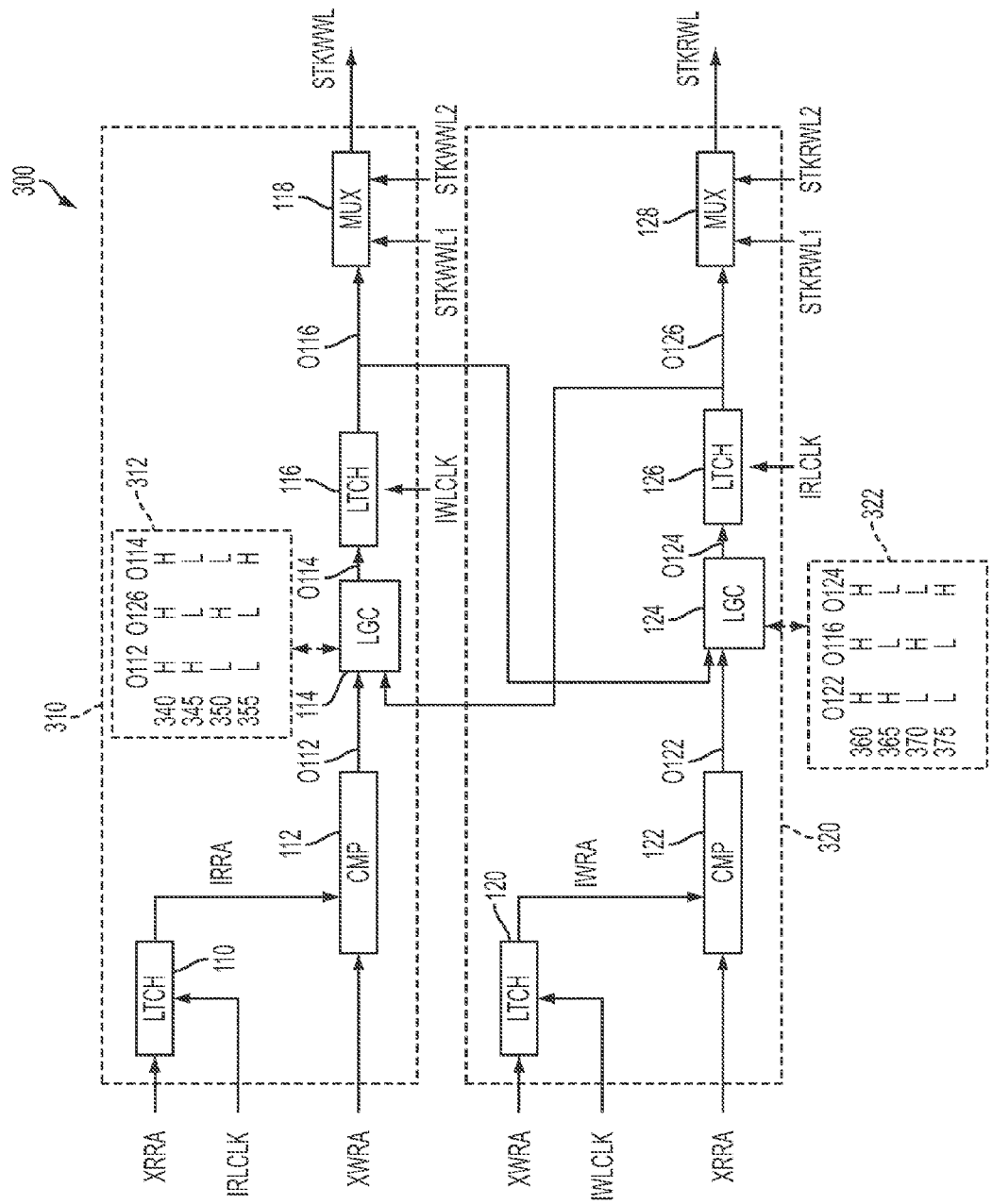
FIG. 3 is a diagram of a circuit generating tracking signals for use by the memory macro in FIG. 2A, in accordance with some embodiments.

FIG. 3 is a diagram of a circuit 300, in accordance with some embodiments. In the illustrative circuit 300, first data is written to memory cell 100W, and second data is read from memory cell 100R. In some embodiments, circuit 300 is part of global control circuit GCTRL. Embodiments of the present disclosure are not limited to locations of circuit 300, however.

A circuit 310 generates a signal STKWWL. In some embodiment, circuit 310 selects either signal STKWWL1 or signal STKWWL2 to be signal STKWWL. A circuit 320 generates a signal STKRWL. In some embodiment, circuit 320 selects either signal STKRWL1 or signal STKRWL2 to be signal STKRWL.

When memory cell 100W and memory cell 100R are on a same row, write word line WWL and read word line RWL are physically next to each other. Signal SWWL on line WWL and SRWL on line RWL thus have coupling effects. In such a condition, circuits 310 and 320 generate signal STKWWL and STKRWL on two corresponding lines that are physically next to each other and that have coupling effects. For example, if circuit 310 selects signal STKWWL1 as signal STKWWL, then circuit 320 selects signal STKRWL1 as signal STKRWL. Effectively, signals STKWWL and STKRWL that represent signals STKWWL1 and STKRWL1 have coupling effects. But if circuit 310 selects signal STKWWL2 as signal STKWWL, then circuit 320 selects signal STKRWL2 as signal STKRWL. Effectively, signals STKWWL and STKRWL that represent signals STKWWL2 and STKRWL2 have coupling effects.

In contrast, when memory cell 100W and memory cell 100R are on two different rows, write word line WWL and read word line RWL are not physically next to each other. Signals SWWL and SRWL thus do not have coupling effects. As a result, circuits 310 and 320 generate signal STKWWL and STKRWL that do not have coupling effects. For example, if circuit 310 selects signal STKWWL1 as signal STKWWL, then circuit 320 selects signal STKRWL2 as signal STKRWL. Effectively, signals STKWWL and STKRWL that represent signals STKWWL1 and STKRWL2 do not have coupling effects. But if circuit 310 selects signal STKWWL2 as signal STKWWL, then circuit 320 selects signal STKRWL1 as signal STKRWL. Effectively, signals STKWWL and STKRWL that represent signals STKWWL2 and STKRWL1 do not have coupling effects.

With reference to circuit 310, a latch (LTCH) 110 receives address XRRA as a data input and clock signal IRLCLK as a clock signal input, and provides an address IRRA. Effectively, a logical state of address IRRA is a logical state of address XRRA at the time of latching by latch 110. In some embodiments, latch 110 uses a rising edge of clock signal IRLCLK for latching. In other words, the logical state of address IRRA is the logical state of address XRRA at the rising edge of clock signal IRLCLK.

In some embodiments, address XWRA and address XRRA arrive at circuit 300 at two different times. For illustration, address XRRA arrives earlier than address XWRA. In such a condition, latch 110 functions to hold address XRRA to result in address IRRA. A comparator (CMP) 112 then compares address IRRA that represents address XRRA with address XWRA when address XWRA arrives.

Comparator (CMP) 112 compares address IRRA and address XWRA and provides a signal O112 as an output. In some embodiments, when signal O112 is logically high, signal IRRA matches signal XWRA. When such a match occurs, address XRRA represented by address IRRA is the same address XWRA. Explained in a different way, when a match occurs, memory cell 100W and memory cell 100R on a same row. In contrast, when signal O112 is logically low, address XRRA represented by address IRRA does not match address XWRA. In such a condition, memory cell 100W and memory cell 100R are on two different rows.

Operations of a logic circuit (LGC) 114 having a truth table 312 are explained below.

A latch (LTCH) 116, based on an edge of clock signal IWLCLK, latches a signal O114 to generate a signal O116. In some embodiments, latch 116 uses a rising edge of clock signal IWLCLK for latching. Explained in a different way, a logical state of signal O116 is a logical state of signal O114 at the rising edge of clock signal IWLCLK. In the embodiments of FIG. 3, latch 116 holds the logical state of signal O114 to result in a logical state of signal O116 for use by multiplexer 118.

Multiplexer (MUX) 118 selects either signal STKWWL1 or signal STKWWL2 as signal STKWWL, based on signal O116. For example, in some embodiments, when signal O116 is logically high, multiplexer 118 selects signal STKWWL1 as signal STKWWL. But if signal O116 is logically low, multiplexer 118 selects signal STKWWL2 as signal STKWWL.

Logic circuit 114 receives signal O112 and signal O126, and generates signal O114. Based on signal O112 and O126, logic circuit 114 provides information on signal O114 so that multiplexer 118 performs its functions. For example, signal O114 is held by latch (LTCH) 116 to result in signal O116. Effectively, signal O114 is represented by signal O116. Multiplexer 118 then selects either signal STKWWL1 or signal STKWWL2 as signal STKWWL, based on signal O116.

Operations of logic circuit 114 are based on truth table 312. In truth table 312 (and 322), a low and a high logical value are represented by a corresponding symbol "L" and "H." In some embodiments, signal O114 is logically high when both signals O112 and O126 are logically high or logically low, as indicated by a line 340 or a line 355 in truth table 312.

With references to line 340, signal O112 is logically high, signal O126 is logically high, and signal O114 is logically high. When signal O112 is logically high, memory cell 100W and memory cell 100R are on the same row. Write word line WWL and read word line RWL thus have coupling effects. In some embodiments, when signal O126 is logically high, multiplexer 128 is configured to select signal TKRWL1 as signal STKRWL. Further, when signal O114 represented by signal O116 is logically high, multiplexer 118 is configured to select signal STKWWL1 as signal STKWWL. Effectively, signals STKWWL1 and STKRWL1 that are selected by respective multiplexers 118 and 128 to result in signals STKWWL and STKRWL also have coupling effects. In summary, when write word line WWL and read word line RWL have coupling effects, signals STKWWL and STKRWL are generated based on the coupling effects of corresponding tracking write word line TKWWL1 and tracking read word line TKRWL1.

With reference to line 355, signal O112 is logically low, signal O126 is logically low, and signal O114 is logically high. When signal O112 is logically low, memory cell 100W and memory cell 100R are on two different rows. Write word line WWL and read word line RWL therefore do not have coupling effects. In some embodiments, when signal O126 is logically low, multiplexer 128 is configured to select signal TKRWL2 as signal STKRWL. Further, when signal O114 represented by signal O116 is logically high, multiplexer 118 is configured to select signal STKWWL1 as signal STKWWL. Effectively, signals STKWWL1 and STKRWL2 that are selected by respective multiplexers 118 and 128 to result in signals STKWWL and STKRWL do not have coupling effects. In summary, when write word line WWL and read word line RWL do not have coupling effects, signals STKWWL and STKRWL are generated based on the non-coupling effects of corresponding tracking write word line TKWWL1 and tracking read word line TKRWL2.

In contrast, signal O114 is logically low when signal O112 and signal O126 have an inverse logical value of one another, as indicated by a line 345 or by a line 350 in truth table 312. With reference to line 345, signal O112 is logically high, signal O126 is logically low, and signal O114 is logically low. When signal O112 is logically high, memory cell 100W and memory cell 100R are on the same row. Write word line WWL and read word line RWL thus have coupling effects. In some embodiments, when signal O126 is logically low, multiplexer 128 is configured to select signal TKRWL2 as signal STKRWL. Further, when signal O114 represented by signal O116 is logically low, multiplexer 118 is configured to select signal STKWWL2 as signal STKWWL. Effectively, signals STKWWL2 and STKRWL2 that are selected by respective multiplexers 118 and 128 to result in signals STKWWL and STKRWL have coupling effects. In summary, when write word line WWL and read word line RWL have coupling effects, signals STKWWL and STKRWL are generated based on the coupling effects of corresponding tracking write word line TKWWL2 and tracking read word line TKRWL2.

With reference to line 350, signal O112 is logically low, signal O126 is logically high, and signal O114 is logically low. When signal O112 is logically low, memory cell 100W and memory cell 100R are on two different rows. Write word line WWL and read word line RWL therefore do not have coupling effects. In some embodiments, when signal O126 is logically high, multiplexer 128 is configured to select signal TKRWL1 as signal STKRWL. Further, when signal O114 represented by signal O116 is logically low, multiplexer 118 is configured to select signal STKWWL2 as signal STKWWL. Effectively, signals STKWWL2 and STKRWL1 that are selected by respective multiplexers 118 and 128 to result in signals STKWWL and STKRWL do not have coupling effects. In summary, when write word line WWL and read word line RWL do not have coupling effects, signals STKWWL and STKRWL are generated based on the non-coupling effects of corresponding tracking write word line TKWWL2 and tracking read word line TKRWL1.

Circuit 320 includes a latch (LTCH) 120, a comparator (CMP) 122, a logic circuit (LGC) 124, a latch 126, and a multiplexer 128 that correspond to latch 110, comparator 112, logic circuit 124, latch 116, and multiplexer 118, respectively. Operations of each sub-circuit of circuit 320 are similar to operations of each sub-circuit of circuit 310, considering changes in respective input signals to each sub-circuit of circuit 320.

For example, a latch (LTCH) 120 receives address XWRA as a data input and clock signal IWLCLK as a clock signal input, and provides an address IWRA. Latch 120 functions to hold address XWRA to result in address IWRA.

Comparator (CMP) 112 compares address IWRA and address XRRA and provides signal O122 as an output. In some embodiments, when signal O122 is logically high, address IWRA matches address XRRA. When a match occurs, address XWRA represented by address IWRA is the same address XRRA. Explained in a different way, when a match occurs, memory cell 100W and memory cell 100R are on the same row.

In contrast, when signal O122 is logically low, address XWRA represented by address IWRA does not match address XRRA. In such a condition, memory cell 100W and memory cell 100R are on two different rows.

Latch (LTCH) 126, based on an edge of clock signal IRLCLK, latches signal O124 to generate a signal O126. In some embodiments, latch 126 uses a rising edge of clock signal IWLCLK for latching. In the embodiments of FIG. 3, latch 126 holds the logical state of signal O124 to result in a logical state of signal O126 for use by multiplexer 128.

Multiplexer (MUX) 128 is configured to select either a signal STKRWL1 or a signal STKRWL2 as a signal STKRWL, based on signal O126. For example, in some embodiments, when signal O126 is logically high, multiplexer 128 is configured to select signal STKRWL1 as signal STKRWL. But if signal O126 is logically low, multiplexer 128 is configured to select signal STKRWL2 as signal STKRWL.

Logic circuit 124 receives signal O122 and signal O116, and generates signal O124. Based on signal O122 and signal O116, logic circuit 124 provides information on signal O124 so that multiplexer 128 performs it functions. For example, signal O124 is held by latch (LTCH) 126 to result in signal O126. Multiplexer 128 then selects either signal STKRWL1 or signal STKRWL2 as signal STKRWL, based on signal O126.

Operations of logic circuit 124 are based on truth table 322. In some embodiments, signal O124 is logically high when both signals O122 and O116 have the same logical values, as indicated by a line 360 or a line 375 in truth table 322.

With reference to line 360, signal O122 is logically high, signal O116 is logically high, and signal O124 is logically high. When signal O122 is logically high, memory cell 100W and memory cell 100R are on the same row. Write word line WWL and read word line RWL thus have coupling effects. In some embodiments, when signal O116 is logically high, multiplexer 128 is configured to select signal TKWWL1 as signal STKWWL. Further, when signal O124 represented by signal O126 is logically high, multiplexer 128 is configured to select signal STKRWL1 as signal STKRWL. Effectively, signals STKWWL1 and STKRWL1 that are selected by respective multiplexers 118 and 128 to result in signals STKWWL and STKRWL have coupling effects. In summary, when write word line WWL and read word line RWL have coupling effects, signals STKWWL and STKRWL are generated based on the coupling effects of corresponding tracking write word line TKWWL1 and tracking read word line TKRWL1.

With reference to line 375, signal O122 is logically low, signal O116 is logically low, and signal O124 is logically high. When signal O122 is logically low, memory cell 100W and memory cell 100R are on two different rows. Write word line WWL and read word line RWL therefore do not have coupling effects. In some embodiments, when signal O116 is logically low, multiplexer 118 is configured to select signal TKWWL2 as signal STKWWL. Further, when signal O124 represented by signal O126 is logically high, multiplexer 128 is configured to select signal STKRWL1 as signal STKRWL. Effectively, signals STKWWL1 and STKRWL2 that are selected by respective multiplexers 118 and 128 to result in signals STKWWL and STKRWL do not have coupling effects. In summary, when write word line WWL and read word line RWL do not have coupling effects, signals STKWWL and STKRWL are generated based on the non-coupling effects of corresponding tracking write word line TKWWL1 and tracking read word line TKRWL2.

In contrast, signal O124 is logically low when signal O122 and O116 have an inverse logical value of one another, as indicated by a line 365 or a line 370 in truth table 322. With reference to line 365, signal O122 is logically high, signal O116 is logically low, and signal O124 is logically low. When signal O122 is logically high, memory cell 100W and memory cell 100R are on the same row. Write word line WWL and read word line RWL thus have coupling effects. In some embodiments, when signal O116 is logically low, multiplexer 118 is configured to receive signal TKWWL2 as signal STKWWL. Further, when signal O124 represented by signal O126 is logically low, multiplexer 128 is configured to select signal STKRWL2 as signal STKRWL. Effectively, signals STKWWL2 and STKRWL2 that are selected by respective multiplexers 118 and 128 to result in signals STKWWL and STKRWL have coupling effects. In summary, when write word line WWL and read word line RWL have coupling effects, signals STKWWL and STKRWL are generated based on the coupling effects of corresponding tracking write word line TKWWL2 and tracking read word line TKRWL2.

With reference to line 370, signal O122 is logically low, signal O116 is logically high, and signal O124 is logically low. When signal O122 is logically low, memory cell 100W and memory cell 100R are on two different rows. Write word line WWL and read word line RWL therefore do not have coupling effects. In some embodiments, when signal O116 is logically high, multiplexer 118 is configured to select signal TKWWL1 as signal STKWWL. Further, when signal O124 represented by signal O126 is logically low, multiplexer 128 is configured to select signal STKRWL2 as signal STKRWL. Effectively, signals STKWWL1 and STKRWL2 that are selected by respective multiplexers 118 and 128 to result in signals STKWWL and STKRWL do not have coupling effects. In summary, when write word line WWL and read word line RWL do not have coupling effects, signals STKWWL and STKRWL are generated based on the non-coupling effects of corresponding tracking write word line TKWWL1 and tracking read word line TKRWL2.

Method

FIG. 4 is a flowchart of a method 400, in accordance with some embodiments. Method 400 illustrates operations of circuit 310 in FIG. 3.

In operation 405, latch 110 holds address XRRA to result in address IRRA.

In operation 410, comparator 112 compares address XWRA with address XRRA represented by address IRRA, to result in signal O112.

In operation 415, logic circuit 114, based on signal O112 and signal O126, generates signal O114. Signal O112 includes information to indicate whether memory cell 100W and memory cell 100R are on the same row or are on two different rows. Signal O126 includes information to indicate whether signal STKRWL1 or signal STKRWL2 is generated by circuit 320 as signal STKRWL. As a result, signal O114 includes information for multiplexer 118 to select signal STKWWL1 or signal STKWWL2 as signal STKWWL. Depending on whether memory cell 100W and memory cell 100R are on the same row or are in two different rows, the pair of signals STKWWL and STKRWL generated by circuits 310 and 320 have coupling effects or do not have coupling effects.

In operation 420, latch 116 holds signal O114 to result in signal O116.

In operation 425, multiplexer 118, based on signal O116 that represents signal O114, selects either signal STKWWL1 or signal STKWWL2 as signal STKWWL.

Operations in FIG. 4 are referenced to circuit 310 and corresponding address XRRA, clock signal IRLCLK, latch 110, address XWRA, comparator 112, logic circuit 114, clock signal IWLCLK, latch 116, signal STKWWL1, signal STKWWL2, and multiplexer 118. Operations of circuit 320 with corresponding address WRRA, clock signal IWLCLK, latch 120, address XRRA, comparator 122, logic circuit 124, clock signal IRLCLK, latch 126, signal STKRWL1, signal STKRWL2, and multiplexer 128 are similar and can be referenced to operations of circuit 310 as explained in FIG. 4.

In the above illustration, two distinct memory cells 100W and 100R are used for illustration. When first data is written to a memory cell 100 and second data is read from the same memory cell 100, the concept described in the present disclosure is applicable. For example, in such a situation, when address XWRA of write word line WWL and address XRRA of read word line RWL of the same memory cell 100 are detected to be the same, circuit 300 generates corresponding signals STKWWL and STKRWL that have coupling effects.

In some embodiments, a circuit comprises a first line, a second line, a first sub-circuit, and a second sub-circuit. The first line has a first signal. The second line has a second signal. The first sub-circuit is configured to generate a first output signal. The second sub-circuit is configured to generate a second output signal. The first output signal and the second output signal have coupling effects if the first signal and the second signal have coupling effects based on the first line and the second line. The first output signal and the second output signal do not have coupling effects if the first signal and the second signal do not have coupling effects.

In some embodiments, a circuit comprises a first latch, a first comparator, a first logic circuit, a second latch, a first selection circuit, a third latch, a second comparator, a second logic circuit, a fourth latch, and a second selection circuit. The first latch is configured to receive a read row address of a first memory cell and a first clock signal, and to generate a first latched signal. The first comparator is configured to compare the first latched signal and a first write row address of a second memory cell, and to generate a first comparator output signal. The first logic circuit is configured to receive the first comparator output signal and a fourth latched output signal, and to generate a first logic circuit output signal. The second latch is configured to receive the first logic circuit output signal and a second clock signal, and to generate a second latched signal. The first selection circuit is configured to select one of a first signal and a second signal as a first output signal, based on the second latched signal. The third latch is configured to receive the write row address of second memory cell and the second clock signal, and to generate a third latched signal. The second comparator is configured to compare the third latched signal and the first read row address of the first memory cell, and to generate a second comparator output signal. The second logic circuit is configured to receive the second comparator output signal and the second latched signal, and to generate a second logic circuit output signal. The fourth latch is configured to receive the second logic circuit output signal and the first clock signal, and to generate the fourth latched signal. The second selection circuit is configured to select one of a third signal and a fourth signal as a second output signal, based on the fourth latched signal.

In some embodiments, a method is based on a first pair of signals on a first pair of electrical lines. A second pair of electrical lines is selected if the first pair of signals has first coupling effects, wherein a second pair of signals on the second pair of electrical lines has second coupling effects based on the second pair of electrical lines. A third pair of electrical lines is selected if the first pair of signals does not have the first coupling effects, wherein a pair of signals on the third pair of electrical lines does not have coupling effects.

In some embodiments, a memory macro comprises a plurality of first lines, a plurality of second lines, a first tracking line, a second tracking line, a third tracking line, a fourth tracking line, and a circuit. The circuit is configured to select the first tracking line word line or the third tracking line as a fifth tracking line or to select the second tracking line or the fourth tracking line as a sixth tracking line, based on the following conditions 1) if a signal on a first line of the plurality of first lines and a signal on a second line of the plurality of second lines have coupling effects based on the first line and the second line then a signal on the fifth tracking line and a signal on the sixth tracking line have coupling effects based on the fifth tracking line and the sixth line or 2) if the signal on the first line and the signal on the second line do not have coupling effects then the signal on the fifth tracking line and the signal on the sixth tracking line do not have coupling effects.

One aspect of this description relates to a circuit. The circuit includes a first latch configured to generate a first latched signal; and a first comparator configured to compare the first latched signal and a write row address of a second memory cell, and to generate a first comparator output signal. The circuit further includes a first logic circuit configured to receive the first comparator output signal and a fourth latched output signal, and generate a first logic circuit output signal. The circuit further includes a second latch configured to receive the first logic circuit output signal and to generate a second latched signal. The circuit further includes a third latch configured to generate a third latched signal. The circuit further includes a second comparator configured to compare the third latched signal and a read row address of a first memory cell, and to generate a second comparator output signal. The circuit further includes a second logic circuit configured to receive the second comparator output signal and the second latched signal, and to generate a second logic circuit output signal. The circuit further includes a fourth latch configured to receive the second logic circuit output signal and to generate the fourth latched signal.

Another aspect of this description relates to a method. The method includes generating a first latched signal; and comparing the first latched signal and a write row address of a second memory cell, and generating a first comparison output signal. The method further includes generating a first logic output signal based on the first comparison output signal and a fourth latched output signal. The method further includes generating a second latched signal based on the first circuit output signal. The method further includes generating a third latched signal. The method further includes comparing the third latched signal and a read row address of a first memory cell, and generating a second comparison output signal. The method further includes generating a second logic output signal based on the second comparison output signal and the second latched signal. The method further includes generating the fourth latched signal based on the second logic output signal.

Still another aspect of this description relates to a memory macro. The memory macro includes a plurality of first lines and a plurality of second lines; and a first tracking line, a second tracking line, a third tracking line, and a fourth tracking line. The memory macro further includes a circuit configured to select the first tracking line or the third tracking line as a fifth tracking line or to select the second tracking line or the fourth tracking line as a sixth tracking line, based on a coupling effect of a signal on a first line of the plurality of first lines and a signal on a second line of the plurality of second lines.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first latch configured to generate a first latched signal;
a first comparator configured to compare the first latched signal and a write row address of a second memory cell, and to generate a first comparator output signal;
a first logic circuit configured to receive the first comparator output signal and a fourth latched signal, and to generate a first logic circuit output signal;
a second latch configured to receive the first logic circuit output signal and to generate a second latched signal;
a third latch configured to generate a third latched signal;
a second comparator configured to compare the third latched signal and a read row address of a first memory cell, and to generate a second comparator output signal;
a second logic circuit configured to receive the second comparator output signal and the second latched signal, and to generate a second logic circuit output signal; and
a fourth latch configured to receive the second logic circuit output signal and to generate the fourth latched signal.

2. The circuit of claim 1, wherein
the first latch is configured to receive the read row address of the first memory cell and a first clock signal; and
the third latch is configured to receive the write row address of the first memory cell and a second clock signal.

3. The circuit of claim 1, further comprising:
a first selection circuit configured to select one of a first signal or a second signal as a first output signal, based on the second latched signal.

4. The circuit of claim 1, further comprising:
a second selection circuit configured to select one of a third signal or a fourth signal as a second output signal, based on the fourth latched signal.

5. The circuit of claim 2, wherein
the circuit further comprises a clock-generator circuit configured to generate at least one of the first clock signal or the second clock signal.

6. The circuit of claim 1, wherein
when the first comparator output signal and the fourth latched signal have a same logic level, the first logic circuit output signal is generated by the first logic circuit as a logical high; and
when the first comparator output signal and the fourth latched signal have a different logic level, the first logic circuit output signal is generated by the first logic circuit as a logical low.

7. The circuit of claim 4, wherein
when the second comparator output signal and the second latched signal have a same logic level, the second logic circuit output signal is generated by the second logic circuit as a logical high; and
when the second comparator output signal and the second latched signal have a different logic level, the second logic circuit output signal is generated by the second logic circuit as a logical low.

8. A method comprising:
generating a first latched signal;
comparing the first latched signal and a write row address of a second memory cell, and generating a first comparison output signal;
generating a first logic output signal based on the first comparison output signal and a fourth latched signal;
generating a second latched signal based on the first logic output signal;
generating a third latched signal;
comparing the third latched signal and a read row address of a first memory cell, and generating a second comparison output signal;
generating a second logic output signal based on the second comparison output signal and the second latched signal; and
generating the fourth latched signal based on the second logic output signal.

9. The method of claim 8, wherein
generating the first latched signal comprises generating the first latched signal based on the read row address of the first memory cell and a first clock signal; and
generating the third latched signal comprises generating the third latched signal based on the write row address of the first memory cell and a second clock signal.

10. The method of claim 8, further comprising:
selecting one of a first signal or a second signal as a first output signal, based on the second latched signal; and
selecting one of a third signal or a fourth signal as a second output signal, based on the fourth latched signal.

11. The method of claim 9, further comprising:
generating the first clock signal or the second clock signal based on a third clock signal received from outside a memory macro.

12. The method of claim 8, wherein
generating the first logic output signal comprises:
generating the first logic output signal as logically high when the first comparison output signal and the fourth latched signal have a same logic level; and
generating the first logic output signal as logically low when the first comparison output signal and the fourth latched signal have a different logic level.

13. The method of claim 8, wherein
generating the second logic output signal comprises:
generating the second logic output signal as logically high when the second comparison output signal and the second latched signal have a same logic level; and
generating the second logic output signal as logically low when the second comparison output signal and the second latched signal have a different logic level.

14. A circuit comprising:
a first circuit configured to generate a first output signal, the first circuit comprising:
a first latch configured to generate a first latched signal;
a first comparator configured to compare the first latched signal and a write row address of a memory cell, and to generate a first comparator output signal;
a first logic circuit configured to generate a first logic circuit output signal based on a first latched output signal and the first comparator output signal; and
a second latch configured to receive the first logic circuit output signal and to generate a second latched signal; and
a second circuit configured to generate a second output signal.

15. The circuit of claim 14, wherein the first circuit further comprises:
a first selection circuit configured to select one of a first signal or a second signal as the first output signal, based on the second latched signal.

16. The circuit of claim 14, wherein the second circuit comprises:
a third latch configured to generate a third latched signal;
a second comparator configured to compare the third latched signal and a read row address of another memory cell, and to generate a second comparator output signal;
a second logic circuit configured to generate a second logic circuit output signal based on the second comparator output signal and the second latched signal; and
a fourth latch configured to receive the second logic circuit output signal and to generate the first latched output signal.

17. The circuit of claim 16, wherein the second circuit further comprises:
a first selection circuit configured to select one of a first signal or a second signal as the second output signal, based on the first latched output signal.

18. The circuit of claim 14, wherein the first latch is configured to receive a read row address of another memory cell.

19. The circuit of claim 16, wherein
the third latch is further configured to receive the write row address of the memory cell; and
the first logic circuit is further configured to generate the first logic circuit output signal based on the first comparator output signal and the first latched output signal.

20. The circuit of claim 14, wherein
the first logic circuit output signal is logically high, if the first comparator output signal and the first latched output signal have a same logic level; and
the first logic circuit output signal is logically low, if the first comparator output signal and the first latched output signal have a different logic level.

* * * * *